US006682657B2

(12) United States Patent
Dutton et al.

(10) Patent No.: US 6,682,657 B2
(45) Date of Patent: Jan. 27, 2004

(54) THREE DIMENSIONAL ETCHING PROCESS

(75) Inventors: David T Dutton, Malvern (GB); Anthony B Dean, Malvern (GB)

(73) Assignee: Qinetiq Limited, London (GB)

( * ) Notice: Subject to any disclaimer, the term of this patent is extended or adjusted under 35 U.S.C. 154(b) by 0 days.

(21) Appl. No.: 09/101,306

(22) PCT Filed: Jan. 9, 1997

(86) PCT No.: PCT/GB97/00043

§ 371 (c)(1),
(2), (4) Date: Jul. 7, 1998

(87) PCT Pub. No.: WO97/25653

PCT Pub. Date: Jul. 17, 1997

(65) Prior Publication Data

US 2003/0057177 A1 Mar. 27, 2003

(30) Foreign Application Priority Data

Jan. 10, 1996 (GB) .............................. 9600469

(51) Int. Cl.⁷ ................................ B81B 7/04
(52) U.S. Cl. .................. 216/2; 216/24; 216/26; 216/49; 216/72; 349/652
(58) Field of Search ................ 216/2, 11, 24, 216/26, 41, 49, 64, 67, 72, 74; 257/55, 95, 98, 189, 425, 432, 441, 615, 629, 631, 636, 638, 642, 646; 65/37, 39

(56) References Cited

U.S. PATENT DOCUMENTS

| | | | |
|---|---|---|---|
| 4,357,704 A | * 11/1982 | Koechner | 372/72 |
| 4,514,252 A | 4/1985 | Roland | 156/643 |
| 4,698,128 A | * 10/1987 | Berglund et al. | 156/643 |
| 4,715,930 A | * 12/1987 | Diem | 437/101 |
| 4,832,788 A | 5/1989 | Nemiroff | 156/643 |
| 4,902,377 A | * 2/1990 | Berglund et al. | 156/643 |
| 4,958,201 A | * 9/1990 | Mimura | 257/25 |
| 5,073,007 A | 12/1991 | Kedmi et al. | 359/565 |
| 5,218,471 A | 6/1993 | Swanson et al. | 359/565 |
| 5,227,915 A | 7/1993 | Grossinger et al. | 359/565 |
| 5,286,338 A | 2/1994 | Feldblum et al. | |
| 5,316,640 A | * 5/1994 | Wakabayashi et al. | 204/192.34 |
| 5,456,798 A | 10/1995 | Koumura et al. | |
| 5,853,960 A | * 12/1998 | Tran et al. | 430/321 |

FOREIGN PATENT DOCUMENTS

GB  2 206 447 B  1/1989

OTHER PUBLICATIONS

Van Nostrand's Scientific Encyclopedia, 6$^{th}$ Ed., p. 2097 (OPTICS), Dec. 1983.*

"Micro–optics has macro potential", Carts, Laser Focus World, Jun. 1991, pp. 93–99.

"Microlens integration with diode lasers and coherent locking of laser arrays", Liau et al, The Lincoln Laboratory Journal, vol. 3, No. 3, pp. 385–393, Dec. 1990.

"Gallium phosphide microlenses by mass transport", Liau et al, Appl. Phys. Lett., 55(2), 1989, pp. 97–99.

"Microlens arrays", Hutley et al, Physics World, Jul. 1991, pp. 27–32.

IBM Technical Disclosure Bulletin, vol. 28, No. 7, pp 3136–3137, Dec. 1, 1985.*

(List continued on next page.)

*Primary Examiner*—Allan Olsen
(74) *Attorney, Agent, or Firm*—Nixon & Vanderhye P.C.

(57) ABSTRACT

A method of forming three-dimensional structures on a substrate by a single reactive ion each run whereby a mask is formed on said substrate before a series of iterations are carried out, each iteration including a mask etch and a substrate etch, so that successive iterations give life to reduction in the mask area and exposure of further areas of substrate.

7 Claims, 2 Drawing Sheets

OTHER PUBLICATIONS

Figure 1A:
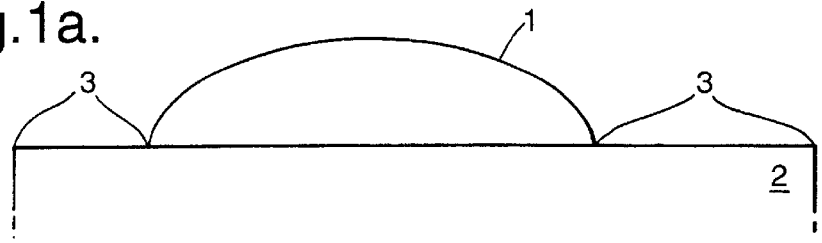
Figure 1B:
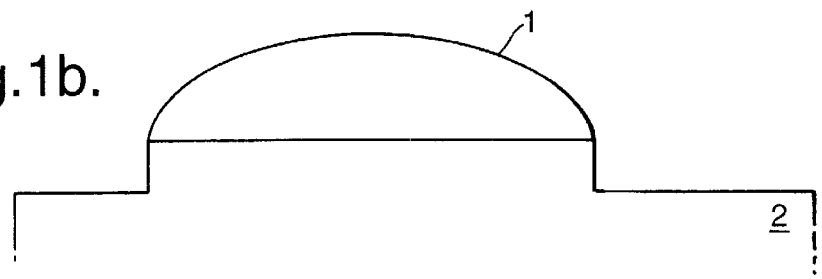

IBM Technical Disclosure Bulletin, vol. 27, No. 6, pp 3259–3260, Bergendahl et al., Nov. 1, 1984.*

Journal of Vacuum Science and Technology: Part B, vol. 9, No. 3, May 1991, pp. 1421–1432, XP000367925 Pearton S J: "Comparison of CH4/H2/AR Reactive Ion Etching and Electron Cyclotron Resonance Plasma Etching of In–Based III–V Alloys" see whole document.

Patent Abstracts of Japan, vol. 010, No. 204 (M–499), Jul. 17, 1986 & JP 61 044627 A (Pioneer Electronic Corp), Mar. 4, 1986, see abstract.

* cited by examiner

THREE DIMENSIONAL ETCHING PROCESS

The current invention relates to the production of three dimensional structures on a substrate by Reactive-Ion Etching. It can be applied to materials such as semiconductor, glass, polyimide or any other which can be etched using a reactive ion plasma.

Three dimensional semiconductor structures are required for optical confinement (for example in visible/infrared lenses, emitters or detectors) and electromagnetic confinement (eg microwave inductors, detectors or sources).

A number of techniques are known for the fabrication of optical confining structures such as microlenses. For example, Hutley et. al. teach the formation of small discs of photoresist which, on heating to melt, are drawn into the shape of small lenses by surface tension. (Physics World, July 1991 pp27–32).

Liau et. al. teach the formation of a stepped structure by repeated applications of photolithography and bromine-methanol etching. Mass transport within this structure to form a lens shape is then effected, again by heating to melt (see Appl. Phys. Lett. 55 (2) 10 July 1989; The Lincoln Laboratory Journal, Volume 3, Number 3, 1990). Other methods of forming microlens arrays are detailed in "Micro-optics has macro potential" Laser Focus World June, 1991. Methods which involve reactive ion etching typically involve repeated applications of photoresist and etch runs. This makes the fabrication process cumbersome.

According to this invention, a method of producing or modifying a three dimensional surface profile on a substrate comprises the steps of (i) forming a mask of resist on the substrate such that some area of the substrate is protected by the mask and some area is exposed and (ii) subjecting the substrate to a plurality of iterations wherein each iteration comprises at least one resist etch and at least one substrate etch, the resist etch being carried out using a suitable resist etchant, which modifies the shape of the mask and hence the area of substrate exposed, and the substrate etch being carried out using a suitable substrate etchant from which the mask affords protection of the substrate, and which removes material from the areas of substrate which are exposed.

In a preferred embodiment, an optical concentrator is formed on the substrate.

In a preferred embodiment the substrate comprises a semiconductor material.

In a preferred embodiment the substrate comprises InSb.

In a further preferred embodiment the substrate etchant comprises a $CH_4/H_2$ plasma.

In a further preferred embodiment the resist etchant comprises an oxygen plasma.

In a further preferred embodiment, a Winston cone is formed in InSb heterostructure material.

Figure 1C:
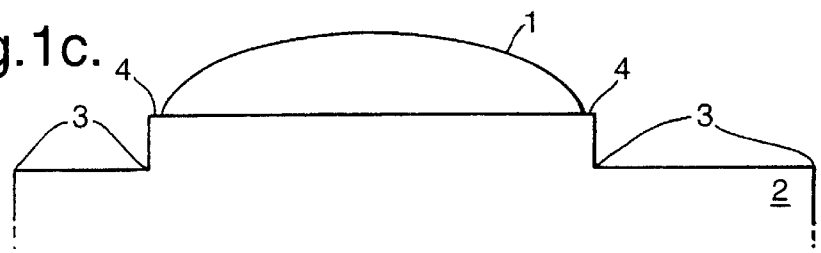
Figure 1D:
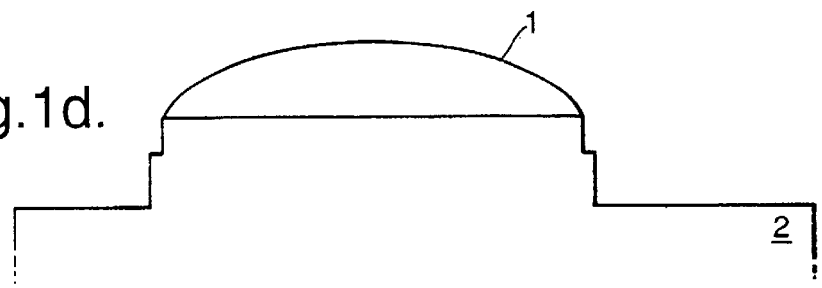
Figure 1E:
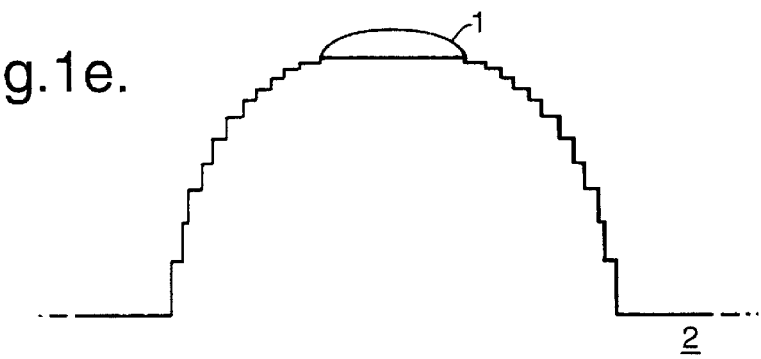
Figure 2A:
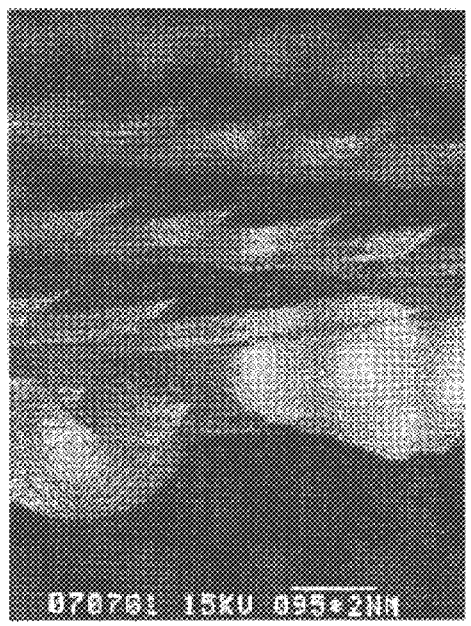
Figure 2B:
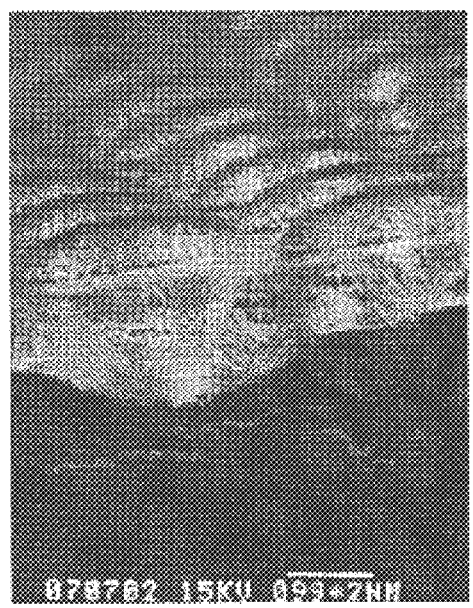

The invention will now be described with reference to the following figures in which FIGS. 1a–1e show representations of the substrate and mask at various stages of a process using the method of the current invention and FIGS. 2a and 2b show scanning electron microscope images of an array of microlenses during two stages of their formation by the method of the current invention.

Referring to FIG. 1a, a dome or button of photolithographic masking resist 1 is applied to a semiconductor substrate 2. This may be formed by, for example, greyscale lithography (see UK patent application 9310013.9) or resist-reflow methods.

The substrate is then etched using a substrate etchant from which the resist 1 affords protection so that material is removed from areas 3 on the substrate 2. This gives rise to the structure shown in FIG. 1b.

Referring to FIG. 1c, the area covered by resist 1 is then reduced, using a suitable resist etchant, so that further areas 4 of substrate 2 are exposed.

Further etching of the substrate using the substrate etchant then removes material from areas 3 and 4 to produce a stepped structure as shown in FIG. 1d.

Repeated etching of the resist 1 and substrate 2, in a single reactive ion etch run, gives rise to the multi-stepped structure shown in FIG. 1e.

Detailed three-dimensional structures can be formed by controlling the rate and time for each of the etching steps. The final resolution of the profile is dependent on the number of alternate substrate and resist etch steps over a given structure height.

This technique can also be used to modify structures formed by other techniques.

Referring to FIGS. 2a and 2b, the microlenses shown therein were fabricated using a Surface Technology Systems (STS) Reactive Ion Etching Machine, Model 340PC, and the following etch conditions:

| | |
|---|---|
| Resist Etch conditions: | Gas: $O_2$, flow rate 80 standard cubic centimeters per minute(sccm); Chamber Pressure: 60 mTorr; RF Power: 60 W. |
| Substrate Etch Conditions: | Gas: $CH_4$, 90 sccm and $H_2$, flow rate 10 sccm; Chamber Pressure: 90 mTorr; RF Power: 50 W. |

The substrate (InSb) was coated with $12 \times 10^4$ m of AZ4562 resist and was processed into straight sided cones using greyscale technology and Ion beam milling. (Other methods of effecting this part of the process will be apparent to those skilled in the art). The sample was then resist etched using the above resist etch conditions for 5 minutes. This was followed by a 5 minute InSb etch using the above substrate-etch conditions and then another 5 minute resist etch. Four iterations of 5 minute InSb etching and 2 minute resist etching were then performed to obtain the structure shown in FIG. 2a.

A further seven steps resulted in the structure shown in FIG. 2b.

Under some conditions, the exothermic nature of the reactive ion etching process causes the resist to reflow. This gives additional flexibility to the process and may obviate the need for greyscale lithography or ex-situ resist reflow using, for example, a hot plate or oven.

What is claimed is:

1. A method of forming an optical confining structure, said method comprising producing or modifying a three dimensional surface profile on a substrate comprising the steps of:

(i) forming a mask of resist on the substrate such that some area of the substrate is protected by the mask and some area is exposed;

(ii) forming the resist into a dome;

(iii) subjecting the substrate and the mask to a plurality of iterations;

wherein each iteration comprises at least one resist etch and at least one substrate etch, the resist etch being carried out using a suitable resist etchant, which modifies the shape of the mask and hence the area of substrate exposed, and the substrate etch being carried out using a suitable substrate etchant from which the mask affords protection of the substrate, and which removes material from the areas of substrate which are exposed, the resist etch and the substrate etch being substantially asynchronous, so that substantially perpendicular straight edges are formed in the substrate.

2. The method of claim 1 an optical concentrator is formed in the substrate.

3. The method of claim 1 or 2 wherein the substrate comprises a semiconductor material.

4. The method of claim 3 where the substrate comprises InSb.

5. The method of claim 4 wherein the substrate etchant comprises a $CH_4/H_2$ plasma.

6. The method of claim 5 where the resist etchant comprises an oxygen plasma.

7. The method of claim 6 where a Winston cone emitter is formed in InSb heterostructure material.

* * * * *